(12) United States Patent
Jhung et al.

(10) Patent No.: US 12,375,059 B2
(45) Date of Patent: *Jul. 29, 2025

(54) BULK ACOUSTIC RESONATOR

(71) Applicant: SKYWORKS GLOBAL PTE. LTD., Singapore (SG)

(72) Inventors: Jae Myoung Jhung, Seoul (KR); Jae Hyung Lee, Seoul (KR); Kwang Jae Shin, Yongin (KR); Myung Hyun Park, Seongnam-si (KR)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/589,296

(22) Filed: Feb. 27, 2024

(65) Prior Publication Data
US 2024/0283427 A1    Aug. 22, 2024

Related U.S. Application Data

(63) Continuation of application No. 17/498,729, filed on Oct. 11, 2021, now Pat. No. 11,916,535, which is a continuation of application No. 16/556,707, filed on Aug. 30, 2019, now Pat. No. 11,146,236.

(60) Provisional application No. 62/724,753, filed on Aug. 30, 2018.

(51) Int. Cl.
*H03H 9/13* (2006.01)
*H03H 9/02* (2006.01)
*H03H 9/17* (2006.01)
*H03H 9/54* (2006.01)

(52) U.S. Cl.
CPC ........ *H03H 9/132* (2013.01); *H03H 9/02007* (2013.01); *H03H 9/171* (2013.01); *H03H 9/54* (2013.01)

(58) Field of Classification Search
CPC .... H03H 9/132; H03H 9/02007; H03H 9/171; H03H 9/54; H03H 9/02118; H03H 9/173
USPC ......................................... 333/133, 186, 187
See application file for complete search history.

(56) References Cited

U.S. PATENT DOCUMENTS

| 7,629,865 B2 * | 12/2009 | Ruby | H03H 9/174 333/188 |
| 11,146,236 B2 * | 10/2021 | Jhung | H03H 9/132 |
| 11,916,535 B2 * | 2/2024 | Jhung | H03H 9/171 |

* cited by examiner

*Primary Examiner* — Jorge L Salazar, Jr.
(74) *Attorney, Agent, or Firm* — Chang & Hale LLP

(57) ABSTRACT

A bulk acoustic resonator can include a piezoelectric layer implemented between first and second electrodes with respective lateral shapes. The first and second lateral shapes can be selected and arranged to provide a resonator shape defined by an outline of an overlap of the first and second electrodes, such that the resonator shape includes N curved sections joined by N vertices of an N-sided polygon, and such that the resonator shape has no axis of symmetry.

18 Claims, 12 Drawing Sheets

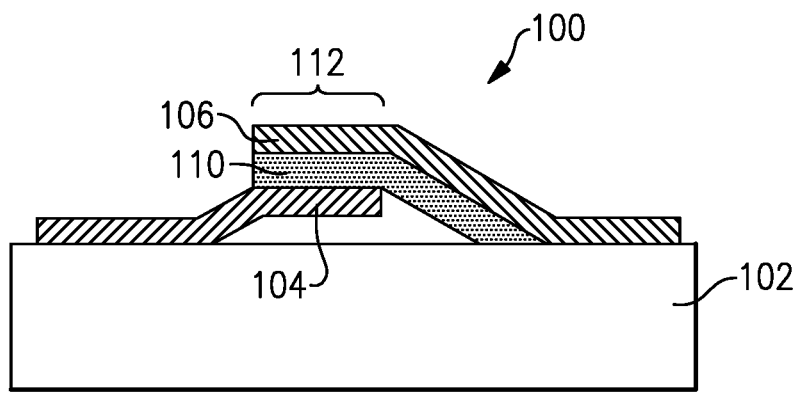
FIG. 4
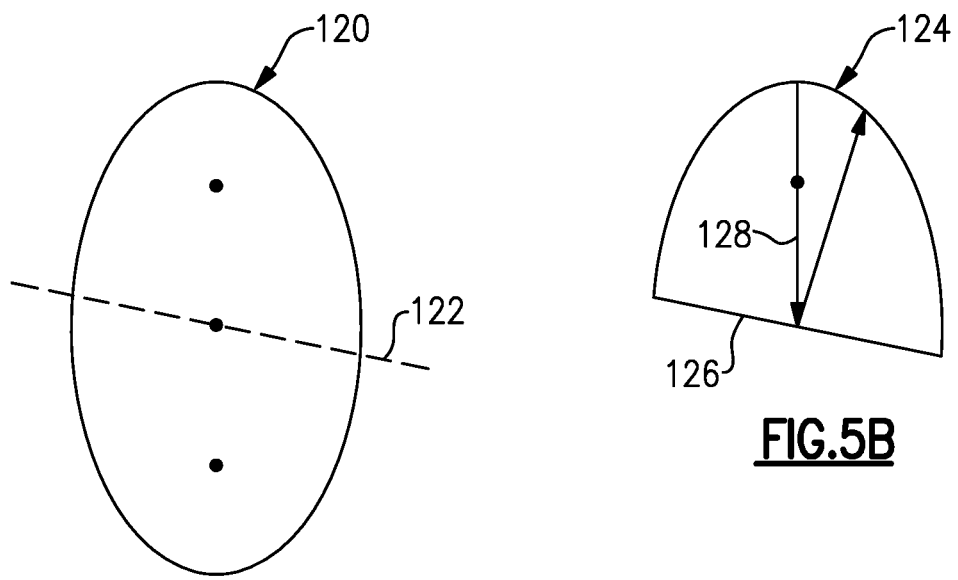
FIG. 5A
FIG. 5B

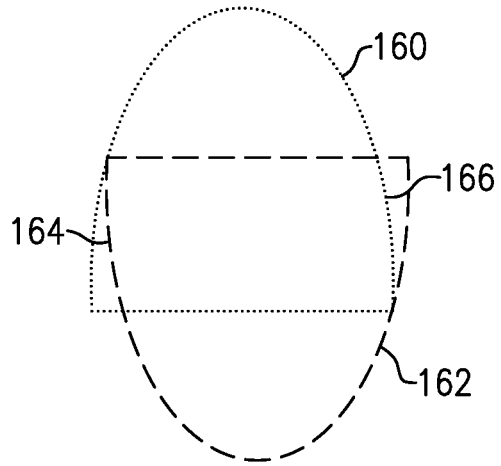 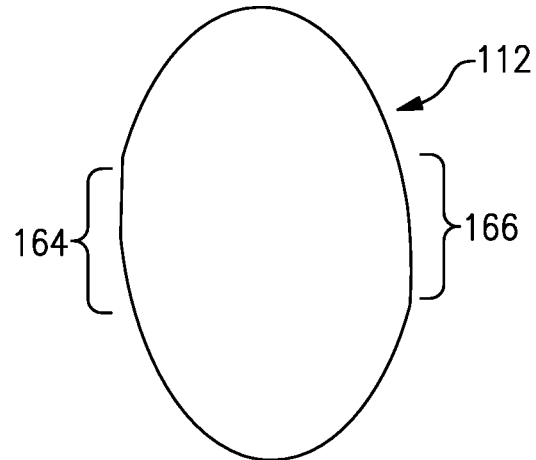
FIG.11A  FIG.11B
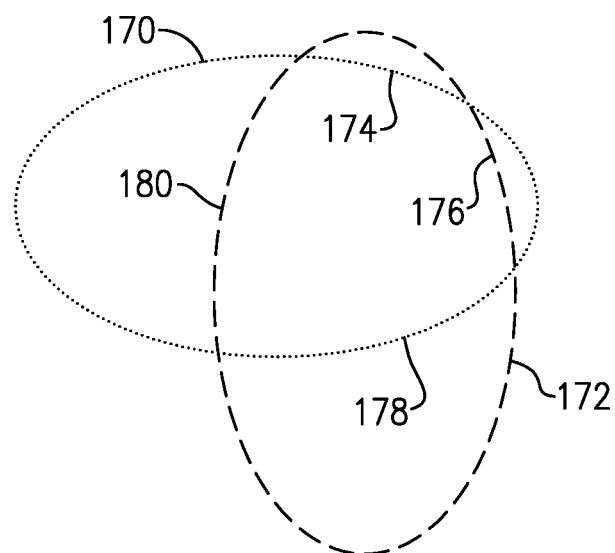 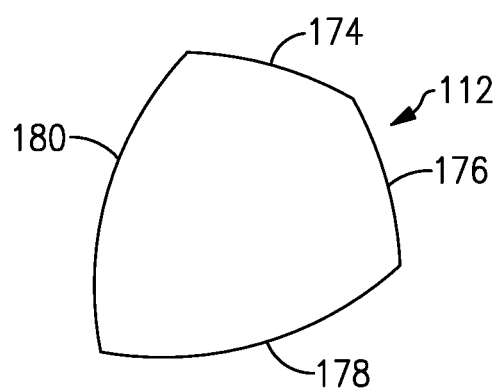
FIG.12A  FIG.12B

BULK ACOUSTIC RESONATOR

CROSS-REFERENCE TO RELATED APPLICATION(S)

This application is a continuation of U.S. application Ser. No. 17/498,729 filed Oct. 11, 2021, entitled DEVICES AND METHODS RELATED TO FILM BULK ACOUSTIC RESONATORS, which is a continuation of U.S. application Ser. No. 16/556,707 filed Aug. 30, 2019, entitled FILM BULK ACOUSTIC RESONATOR HAVING SUPPRESSED LATERAL MODE, which claims priority to and the benefit of the filing date of U.S. Provisional Application No. 62/724,753 filed Aug. 30, 2018, entitled FILM BULK ACOUSTIC RESONATOR HAVING SUPPRESSED LATERAL MODE, the benefits of the filing dates of which are hereby claimed and the disclosures of which are hereby expressly incorporated by reference herein in their entirety.

BACKGROUND

Field

The present disclosure relates to bulk acoustic resonators.

Description of the Related Art

A bulk acoustic resonator is a device having a piezoelectric material between two electrodes. When an electromagnetic signal is applied to one of the electrodes, an acoustic wave is generated in the piezoelectric material and propagates to the other electrode.

Depending on the thickness of the piezoelectric material, resonance of such an acoustic wave is established, and on the other electrode, an electromagnetic signal having a frequency corresponding to the resonant acoustic wave is generated. Thus, such a bulk acoustic resonator can be utilized to provide filtering functionality for an electromagnetic signal such as a radio-frequency (RF) signal.

In many applications, the piezoelectric material between the electrodes is relatively thin and implemented as a film. Thus, a bulk acoustic resonator is sometimes referred to as a thin-film bulk acoustic resonator (TFBAR) or as a film bulk acoustic resonator (FBAR).

SUMMARY

According to a number of implementations, the present disclosure relates to a bulk acoustic resonator that includes a piezoelectric layer having a first side and a second side, a first electrode having a first lateral shape implemented on the first side of the piezoelectric layer, and a second electrode having a second lateral shape implemented on the second side of the piezoelectric layer. The first and second lateral shapes are selected and arranged to provide a resonator shape defined by an outline of an overlap of the first and second electrodes. The resonator shape includes N curved sections joined by N vertices of an N-sided polygon. The resonator shape is configured to have no axis of symmetry.

In some embodiments, the quantity N can be an integer greater or equal to 4. In some embodiments, the quantity N can be equal to 5.

In some embodiments, each of the N curved sections can be a smooth curve. Each of the N vertices can be defined by joining of two neighboring smooth curves, such that the two neighboring smooth curves combined is not a smooth curve due to the respective vertex. In some embodiments, each of the N vertices can be a sharp point between the respective neighboring smooth curves. In some embodiments, each smooth curve can have an inward facing concave shape.

In some embodiments, each of the N curved sections can be a part of an ellipse. In some embodiments, at least two of the N curved sections can be parts of one ellipse. In some embodiments, the N curved sections can be parts of N respective ellipses.

In some embodiments, the bulk acoustic resonator a film bulk acoustic resonator.

In some embodiments, neither of the first and second lateral shape can have the same lateral shape as the resonator shape. In some embodiments, at least one of the first and second lateral shape can be configured to have substantially the same lateral shape as the resonator shape. For example, one of the first and second lateral shape can be configured to have substantially the same lateral shape as the resonator shape, and the other lateral shape can be configured to have a larger area to thereby include a non-overlapping portion. In another example, each of the first and second lateral shape can be configured to have substantially the same lateral shape as the resonator shape.

In some implementations, the present disclosure relates to a method for fabricating a bulk acoustic resonator. The method includes forming a first electrode having a first lateral shape, providing a piezoelectric layer on the first electrode, and forming a second electrode having a second lateral shape on the piezoelectric layer such that the piezoelectric layer is between the first and second electrodes. The forming of the first electrode and the forming of the second electrode include selecting and arranging the first and second lateral shapes to provide a resonator shape defined by an outline of an overlap of the first and second electrodes, such that the resonator shape includes N curved sections joined by N vertices of an N-sided polygon, and such that the resonator shape is configured to have no axis of symmetry.

In a number of implementations, the present disclosure relates to a film bulk acoustic resonator device that includes a substrate, first and second electrodes implemented over the substrate, and a piezoelectric layer implemented between the first and second electrodes. The first and second electrodes are configured to provide a resonator shape defined by an outline of an overlap of the first and second electrodes, with the resonator shape including N curved sections joined by N vertices of an N-sided polygon, and the resonator shape being configured to have no axis of symmetry.

In some embodiments, the film bulk acoustic resonator device can be a radio-frequency filter.

In accordance with some implementations, the present disclosure relates to a packaged module that includes a packaging substrate configured to receive a plurality of components, and a film bulk acoustic resonator device implemented on the packaging substrate. The film bulk acoustic resonator device includes a substrate, and first and second electrodes implemented over the substrate. The film bulk acoustic resonator device further includes a piezoelectric layer implemented between the first and second electrodes that are configured to provide a resonator shape defined by an outline of an overlap of the first and second electrodes, with the resonator shape including N curved sections joined by N vertices of an N-sided polygon, and the resonator shape being configured to have no axis of symmetry.

In some embodiments, the packaged module can be a front-end module configured to support wireless operations involving radio-frequency signals.

In some implementations, the present disclosure relates to a wireless device that includes an antenna configured to support either or both of transmission and reception of respective signals, and a front-end system in communication with the antenna. The front-end system includes a film bulk acoustic resonator filter having a substrate, and first and second electrodes implemented over the substrate. The film bulk acoustic resonator filter further includes a piezoelectric layer implemented between the first and second electrodes that are configured to provide a resonator shape defined by an outline of an overlap of the first and second electrodes, such that the resonator shape includes N curved sections joined by N vertices of an N-sided polygon, and the resonator shape is configured to have no axis of symmetry.

In some embodiments, the wireless device can be configured to provide cellular communication functionality.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 4 depicts a side view of an FBAR having a lateral shape that does not include an axis of symmetry.

FIGS. 5A-5E show an example of how a resonator can be designed to provide the lateral shape of FIG. 4.

FIGS. 11A and 11B show an example a resonator shape that includes a combination of two ellipse-based shapes.

FIGS. 12A and 12B show another example a resonator shape that includes a combination of two ellipse-based shapes.

DETAILED DESCRIPTION OF SOME EMBODIMENTS

The headings provided herein, if any, are for convenience only and do not necessarily affect the scope or meaning of the claimed invention.

Described herein are various examples related to film bulk acoustic resonators (FBARs) and related devices having suppressed or reduced lateral mode waves. Although such examples are described in the context of FBARs, it will be understood that one or more features of the present disclosure can also be implemented in other types of resonators, including devices that are similar to FBARs but referred to in different terms.

Figure 1A:
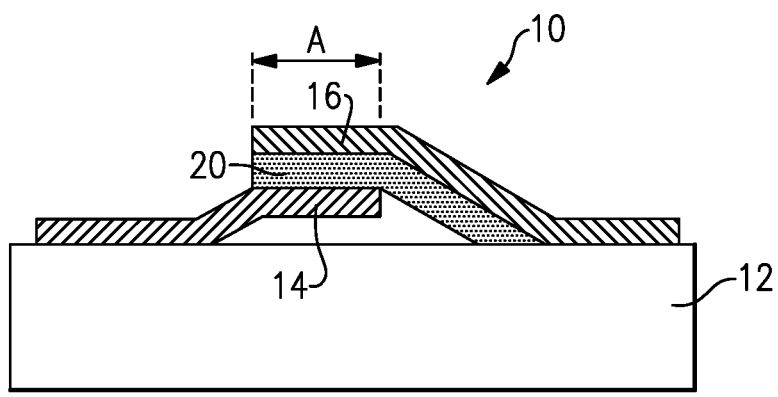
FIG. 1A depicts a side view of a film bulk acoustic resonator (FBAR) device having a resonator formed on a substrate.
Figure 1B:
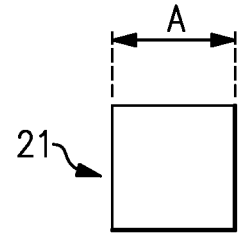
FIG. 1B shows a plan view of an outline of overlapping portions of the first and second electrodes.

FIG. 1A depicts a side view of a typical FBAR device 10 having a resonator formed on a substrate 12. Such a resonator can be formed by positioning a piezoelectric material layer 20 (also referred to herein as a piezoelectric layer, or simply piezoelectric) between a first electrode (e.g., upper electrode 16) and a second electrode (e.g., lower electrode 14). FIG. 1B shows a plan view of an outline 21 of overlapping portions of the first and second electrodes. It will be understood that the piezoelectric material is present between the first and second electrodes 16, 14 and at least within such an outline. For the purpose of description, such an outline of overlapping portion of the electrodes and the piezoelectric layer can be referred to as a resonator shape or simply as a resonator. In the example of FIG. 1A, such a resonator shape (21) is shown to be a square shape with a side dimension of A.

If a radio-frequency (RF) signal is applied to the resonator through one of the electrodes, a corresponding acoustic wave is propagated through the piezoelectric layer 20 towards the other electrode and leaves that electrode as an RF signal having a frequency corresponding to a resonant frequency of the acoustic wave established in the piezoelectric layer 20. Thus, the resonator can provide an excellent filtering functionality, with the filtered frequency depending on the thickness of the piezoelectric layer.

Typically, much of the acoustic waves travel through the piezoelectric layer 20 in a direction perpendicular to the upper and lower electrodes 16, 20. For the purpose of description, such a propagation direction can be assumed to be a Z-direction. In a typical FBAR device, the piezoelectric layer 20 supports some lateral mode waves along one or more directions (e.g., directions in X, Y or combination thereof).

It is noted that if a resonator has a symmetrical lateral shape, such as a square, a circle, etc., a portion of the lateral wave components may be totally reflected and such total reflection may cause superposition of the lateral waves, thereby generating undesired noise. Typically, such superposition of lateral waves caused by total reflection (or substantially total reflection) can result due to presence of opposing boundary surfaces that are parallel to each other. Such parallel surfaces can include, for example, a surface defined by a plane, a surface defined by a point or small area of a tangent plane, or some combination thereof.

Figure 2A:
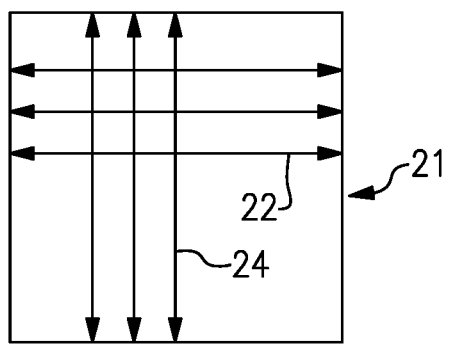
FIG. 2A shows a resonator having a square shape, similar to the example of FIG. 1B.
Figure 2B:
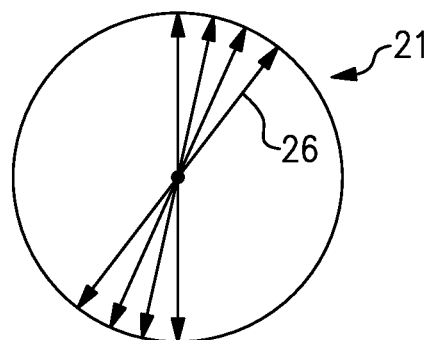
FIG. 2B shows a resonator having a circular shape with a rotational symmetry about the center of the circle.

For example, FIGS. 2A and 2B show resonators having relatively high degrees of symmetry. More particularly, FIG. 2A shows a resonator 21 having a square shape, similar to the example of FIG. 1B. Such a square shape has an order of rotational symmetry (about the center of the square) of 4. FIG. 2B shows a resonator 21 having a circular shape; and such a circular shape has an order of rotational symmetry (about the center of the circle) of that is essentially infinite.

Referring to the example of FIG. 2A, the square shape of the resonator 21 includes two sets of opposing side wall surfaces, with each set having opposing side wall surfaces that are parallel to each other. Accordingly, numerous lateral waves undergoing total reflections can be supported. For example, lateral waves undergoing total reflections between right and left side walls (when viewed as shown in FIG. 2A) are depicted as double-ended arrows 22. Similarly, lateral waves undergoing total reflections between upper and lower side walls (when viewed as shown in FIG. 2A) are depicted as double-ended arrows 24.

Referring to the example of FIG. 2B, the circular shape of the resonator 21 includes essentially an infinite number of pairs of tangent surfaces, with each pair of tangent surfaces being associated with tangent planes on the opposite sides of the circle. Accordingly, numerous lateral waves undergoing total reflections can be supported. For example, lateral waves undergoing total reflections between respective opposing tangent surfaces and passing through the center of the circle are depicted as double-ended arrows 26.

Figure 3:
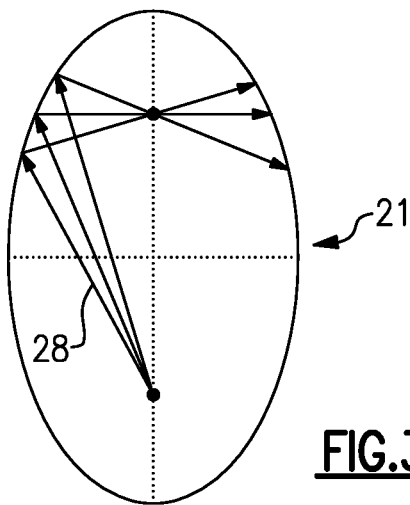
FIG. 3 shows an example of a non-circular elliptical shaped resonator having a degree of symmetry that is lower than that of the circular shaped resonator of FIG. 2B.

FIG. 3 shows an example of an elliptical shaped resonator 21 having a degree of symmetry that is lower than that of the circular shaped resonator of FIG. 2B. Thus, such an elliptical shaped resonator includes less number of sets of opposing side wall surfaces. However, there are tangent surfaces associated with an ellipse that can be problematic in terms of lateral waves. By way of an example, a pair of opposing tangent surfaces at opposing ends of the major axis can support a lateral wave undergoing total reflections at the vertices. Similarly, a pair of opposing tangent surfaces at opposing ends of the minor axis can also support a lateral wave undergoing total reflections.

Referring to the example of FIG. 3, it is also noted that lateral waves may also be concentrated around either or both foci of the elliptical shaped resonator 21. While such lateral waves, indicated as single-ended arrows 28, may not undergo total reflections between opposing surfaces, they still can be problematic.

In some embodiments, a resonator having one or more features as described herein can include a lateral shape that does not include an axis of symmetry, and/or does not include opposing parallel surfaces or tangent surfaces of the lateral boundary that are joinable by a normal line. FIG. 4 shows a FBAR device 100 having such a resonator.

Referring to FIG. 4, the FBAR device 100 can include a resonator 112 formed on a substrate 102. Such a resonator can be formed by positioning a piezoelectric layer 110 between a first electrode (e.g., upper electrode 106) and a second electrode (e.g., lower electrode 104). For the purpose of description, the resonator 112 can include overlapping portions of the first electrode 106, the piezoelectric layer 110, and the second electrode 104. For the purpose of description, such an overlapping portion of the electrodes and the piezoelectric layer can be referred to as a resonator shape or simply as a resonator.

FIGS. 5A-5E show an example of how a resonator (112 in FIG. 5E) can be designed to provide some or all of the foregoing feature where the lateral shape of the resonator does not include an axis of symmetry, and/or does not include opposing parallel surfaces or tangent surfaces the lateral boundary that are joinable by a normal line.

In some embodiments, such a resonator shape can be a part of an elliptical shape. For example, and as shown in FIG. 5A, an elliptical shape 120 can be provided. To remove both of the symmetry axes (major axis and minor axis), such an elliptical shape can be cut along a line 122 that forms a non-zero angle with respect to the minor axis. A similar cut can be made with respect to the major axis; however, in some embodiments, it is preferable to maintain a desired aspect ratio between general length and general width of a resonator.

FIG. 5B shows a shape 124 that results from a cut along the line 122 of FIG. 5A. Such a shape is shown to include a boundary 126 that no longer supports a lateral wave along the major axis (of the original ellipse) and undergoing total reflections at the vertices (at the ends of the major axis). Instead, a lateral wave (indicated as a single-ended arrow 128) travelling along what is remaining of the major axis is shown to pass through the remaining focus, and undergo a reflection at the angled boundary 126 so as to be directed away from the major axis.

Figure 5C:
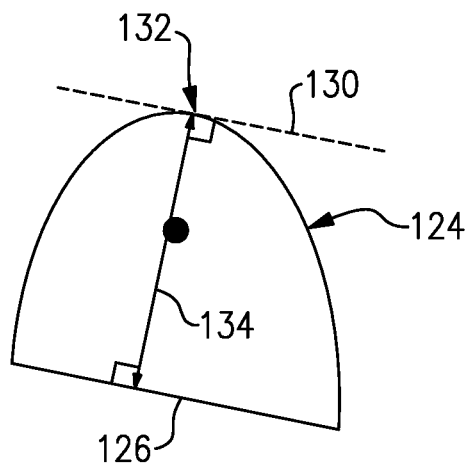

In some embodiments, the example resonator shape of FIG. 5B can provide a reduction in noise, when compared to the elliptical shaped resonator of FIG. 3. However, and as shown in FIG. 5C, the shape 124 of FIG. 5B still includes a tangent surface 130 that can support a lateral wave (depicted as a double-ended arrow 134) between the tangent surface 130 (at a location 132) and the surface associated with the boundary 126.

Figure 5D:
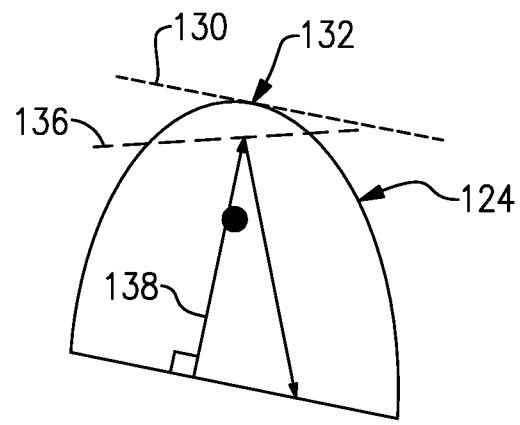

Accordingly, FIG. 5D shows that in some embodiments, another cut can be made to the example shape 124 of FIGS. 5B and 5C. In FIG. 5D, such a cut can be implemented along a line 136, and the resulting shape is indicated as 112 in FIG. 5E. FIG. 5D also shows an example of how a lateral wave (depicted as a single-ended arrow 138) that would have undergone reflections between the pair of planes 130, 126 in FIG. 5C, is now directed away from the original direction (of the lateral wave 134 of FIG. 5C).

It will be understood that in the example of FIG. 5D, other cuts can be implemented to achieve a configuration of the cut line 136. For example, a cut can be made so that the reflected lateral wave (138 in FIG. 5D) is directed to the left side of the original direction instead of to the right side (as in FIG. 5D). In some embodiments, the example cut of FIG. 5D may be preferable since the reflected portion needs to travel further before encountering another boundary, and therefore being more likely to be attenuated within the resonator.

Figure 5E:
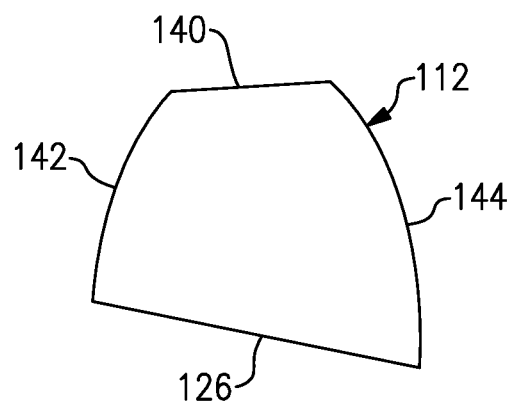

In the example of FIG. 5E, the resonator 112 is shown to have lateral shape that includes curved boundaries 142, 144 that are parts of an elliptical shape, and straight boundaries 126, 140 that can be obtained by respective cuts on the elliptical shape. In some embodiments, such straight boundaries may be easier to implement by cutting of an elliptical shaped resonator; however, it will be understood that a resonator having one or more features as described herein does not necessarily require that any boundary have a curved shape or a straight-line shape. Accordingly, in the context of the ellipse-based example of FIG. 5E, each of the boundaries 126, 140 may or may not be a straight line.

Figure 6:
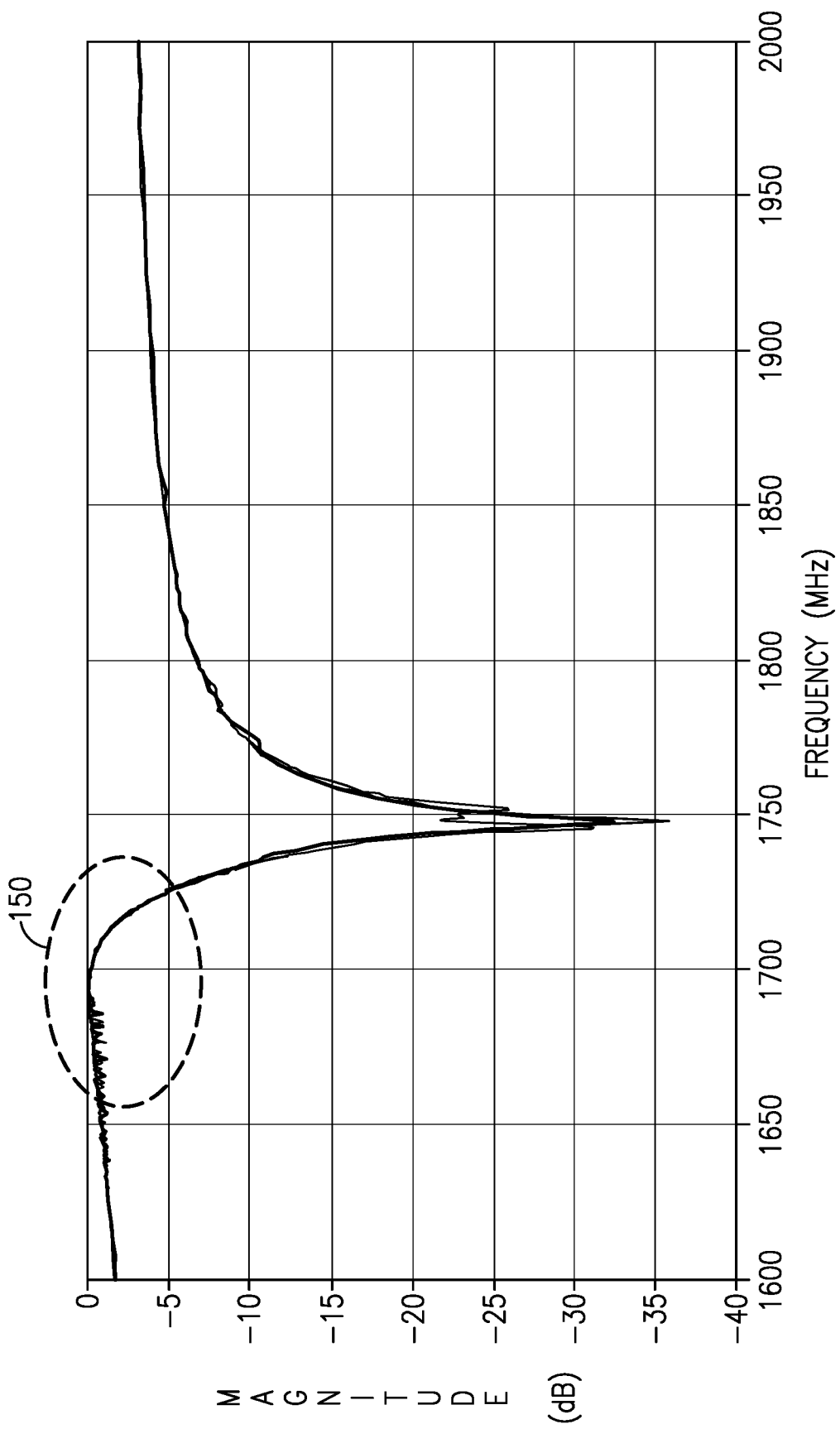
FIG. 6 shows plots of scattering parameter S21 for the square shaped resonator of FIG. 2A, the circle shaped resonator of FIG. 2B, and the ellipse shaped resonator of FIG. 3.
Figure 7:
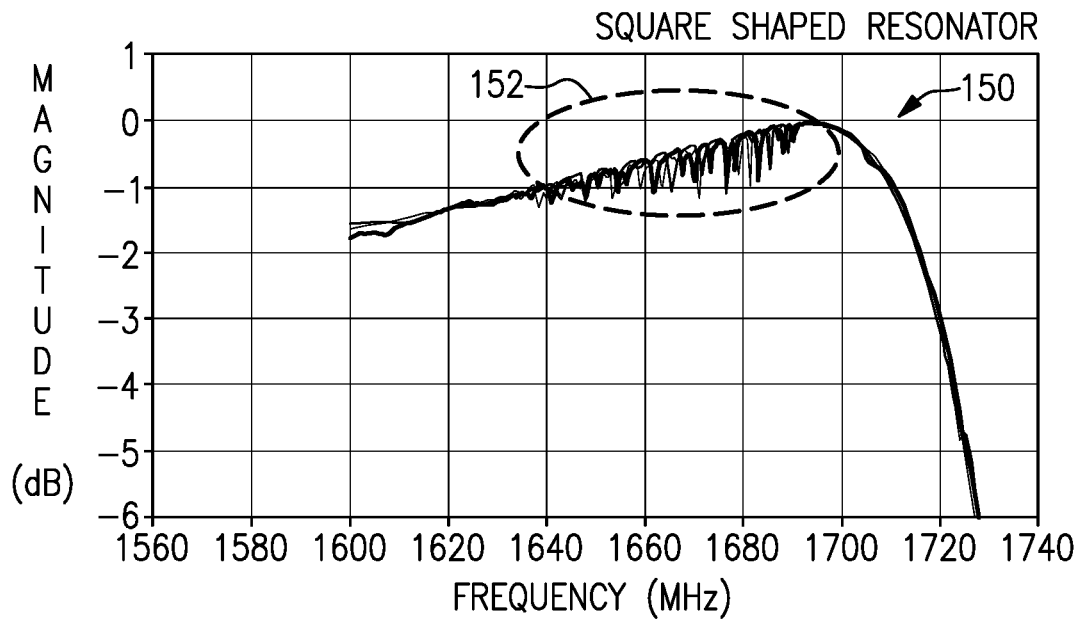
FIG. 7 shows an enlarged view of a portion of FIG. 6, for the square shaped resonator.
Figure 8:
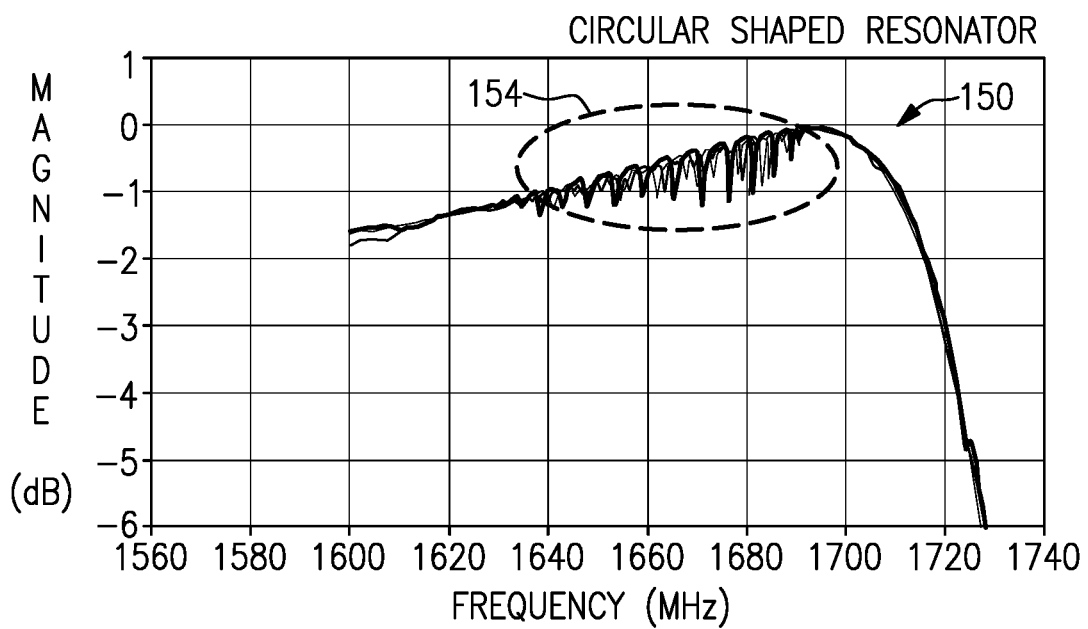
FIG. 8 shows an enlarged view of a portion of FIG. 6, for the circle shaped resonator.
Figure 9:
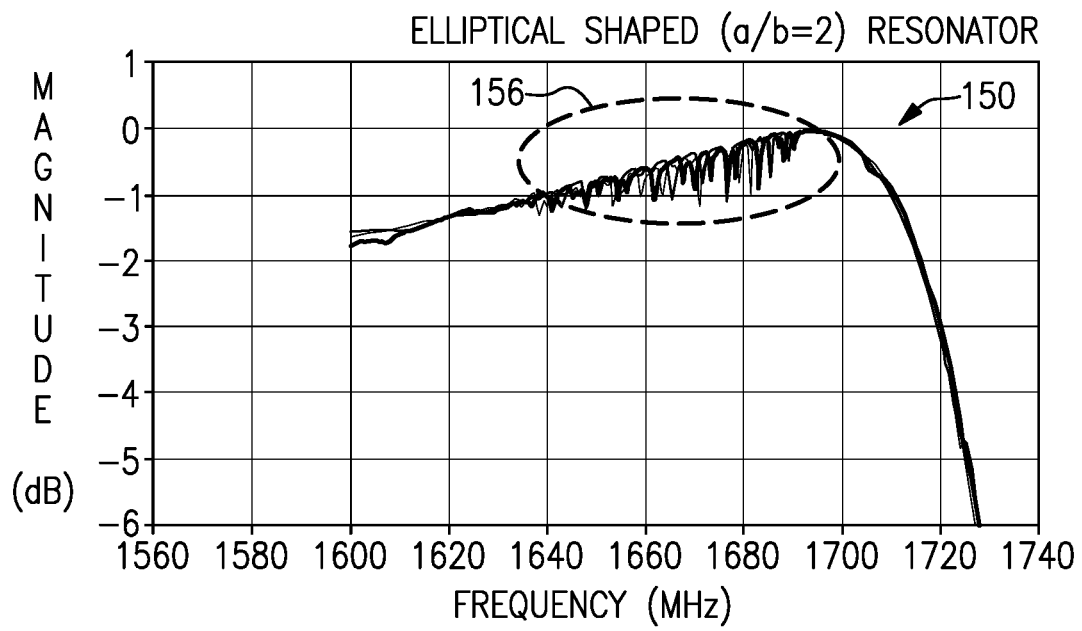
FIG. 9 shows an enlarged view of a portion of FIG. 6, for the ellipse shaped resonator.

FIGS. 6-10 show examples of comparison of performance parameters associated with the example resonators of FIG. 2A (square shape), FIG. 2B (circle shape), FIG. 3 (ellipse shape), and FIG. 5E (ellipse based shaped with cuts). More particularly, FIG. 6 shows plots of scattering parameter S21 for the square shaped resonator (FIG. 2A), the circle shaped resonator (FIG. 2B), and the ellipse shaped resonator (FIG. 3, with an aspect ratio of 2:1). FIG. 7 shows an enlarged view of the portion indicated as 150 in FIG. 6, for the square shaped resonator; FIG. 8 shows an enlarged view of the portion 150, for the circle shaped resonator; and FIG. 9 shows an enlarged view of the portion 150, for the ellipse shaped resonator.

Referring to FIG. 7, one can see that in a region 152 of the enlarged view 150, the S21 fluctuates significantly, indicating that noise level is relatively large for the square shaped resonator. Similarly, and referring to FIG. 8, one can see that in a region 154 of the enlarged view 150, the S21 fluctuates significantly, indicating that noise level is relatively large for the circle shaped resonator.

Referring to FIG. 9, one can see that in a region 156 of the enlarged view 150, noise level for the ellipse shaped resonator is noticeably smaller than the noise levels for the square and circle shaped resonators. However, the noise level for the ellipse shaped resonator is still significant.

Figure 10:
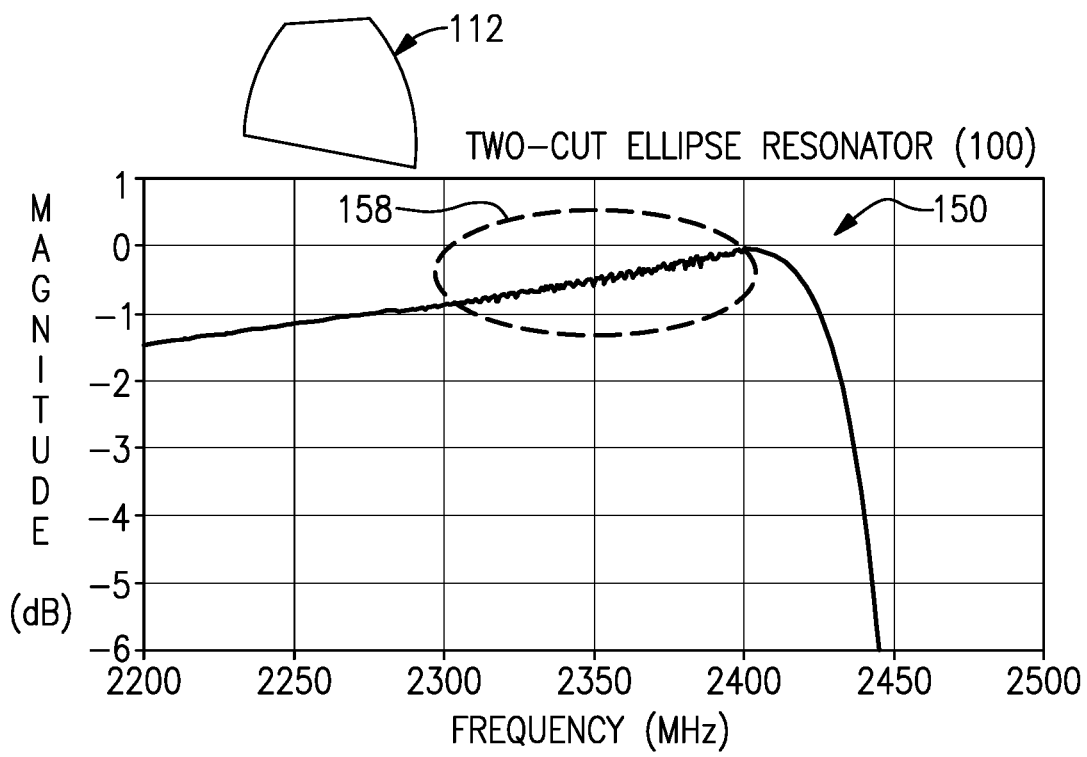
FIG. 10 shows an enlarge region similar to the examples of FIGS. 7-9, but for a resonator having an ellipse based shape with cuts.

FIG. 10 shows an enlarge region 150 similar to the examples of FIGS. 7-9, but for a resonator having an ellipse based shape with cuts (112 in FIG. 5E). One can see that in a region 158 of the enlarged view 150, noise level for the ellipse based shape resonator 112 is significantly reduced when compared to the ellipse shaped resonator example of FIG. 9.

In some embodiments, a shaped resonator having one or more features as described herein can be implemented in a number of ways, including the example described in reference to FIG. 5E. Such a shaped resonator can be based on an elliptical shape, a non-elliptical shape, or any combination thereof.

For example, in the context of ellipse-based resonators, FIGS. 11 and 12 show resonators having one or more desirable features as described herein. In a first example, FIG. 11A shows that in some embodiments, a resonator shape 112 of FIG. 11B can be achieved by combining two ellipse-based shapes 160, 162. More particularly, the first ellipse-based shape 160 can be obtained by cutting a portion of a full ellipse along a line parallel to its minor axis. Similarly, the second ellipse-based shape 162 can be obtained by cutting a portion of a full ellipse along a line parallel to its minor axis. In some embodiments, the first and second ellipse-based shapes 160, 162 can be identical. In some embodiments, the first and second ellipse-based shapes 160, 162 may not be identical.

Referring to FIG. 11A, the first and second ellipse-based shapes 160, 162 can be arranged as shown (in which one is inverted with respect to the other, and offset in X and Y directions), so as to result in an overlapping region that includes overlapping boundaries 164, 166. The overall shape 112 of the resonator of FIG. 11B can be obtained by cutting or forming a resonator layer to include the outline of two ellipses, with boundaries associated with overlapping curves 164, 166.

Configured in the foregoing manner, lateral waves can be inhibited or reduced from being concentrated onto the major and minor axes associated with an ellipse. Accordingly, performance parameter such as noise can be improved.

In a second example, FIG. 12A shows that in some embodiments, a resonator shape 112 of FIG. 12B can be achieved by combining two ellipse shapes 170, 172. More particularly, the first ellipse shape 170 can be arranged with the second ellipse shape 172, such that the major axes of the two ellipses are perpendicular. In some embodiments, such an arrangement can include a configuration where neither of the major and minor axes of each ellipse is fully included in the overlapping region, and none of the foci of the two ellipses coincide with another focus.

Referring to FIG. 12A, the first and second ellipse shapes 170, 172 can be arranged as shown and described above, so as to result in an overlapping region that includes overlapping boundaries 174, 176, 178, 180. The overall shape 112 of the resonator of FIG. 12B can be obtained by cutting or forming a resonator layer to include the such boundaries (174, 176, 178, 180).

Configured in the foregoing manner, lateral waves can be inhibited or reduced from being concentrated onto the major and minor axes associated with an ellipse. Accordingly, performance parameter such as noise can be improved.

Figure 13A:
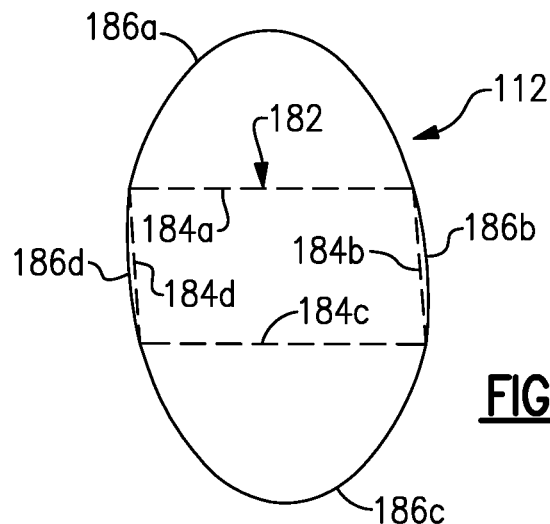
FIGS. 13A-13D show that in some embodiments, a resonator shape can include a curved section for each side of a polygon.

In the examples described above in reference to FIGS. 11 and 12, each resonator shape 112 can be characterized by a polygon with a curved section joining a pair of vertices associated with each side of the polygon. For example, FIG. 13A shows a resonator shape 112 that is similar to the resonator shape 112 of FIG. 11B. Such a resonator shape is shown to include four vertices that can be joined by four sides 184a, 184b, 184c, 184d to define a four-sided polygon 182. The side 184a is shown to correspond to a curved section 186a; the side 184b is shown to correspond to a curved section 186b; the side 184c is shown to correspond to a curved section 186c; and the side 184d is shown to correspond to a curved section 186d. It is noted that in the example of FIG. 11B, each of the curved sections 186a, 186b, 186c, 186d is a part of an ellipse. However, it will be understood that in some embodiments, a curved section of a polygon-based resonator shape (e.g., resonator shape 112 of FIG. 13A based on a four-sided polygon) can be a portion of an ellipse or a curved portion of a non-ellipse shape.

Figure 13B:
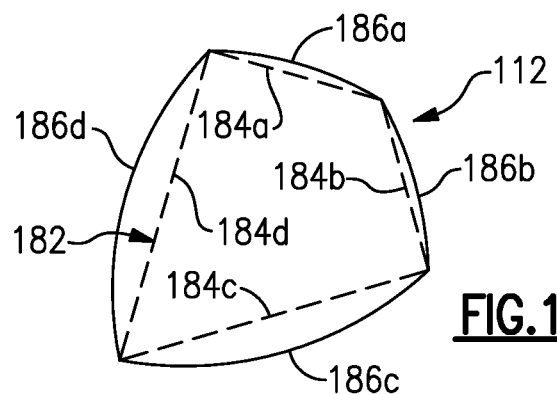

For example, FIG. 13B shows a resonator shape 112 that is similar to the resonator shape 112 of FIG. 12B. Such a resonator shape is shown to include four vertices that can be joined by four sides 184a, 184b, 184c, 184d to define a four-sided polygon 182. The side 184a is shown to correspond to a curved section 186a; the side 184b is shown to correspond to a curved section 186b; the side 184c is shown to correspond to a curved section 186c; and the side 184d is shown to correspond to a curved section 186d. It is noted that in the example of FIG. 12B, each of the curved sections 186a, 186b, 186c, 186d is a part of an ellipse. However, it will be understood that in some embodiments, a curved section of a polygon-based resonator shape (e.g., resonator shape 112 of FIG. 13B based on a four-sided polygon) can be a portion of an ellipse or a curved portion of a non-ellipse shape.

Figure 13C:
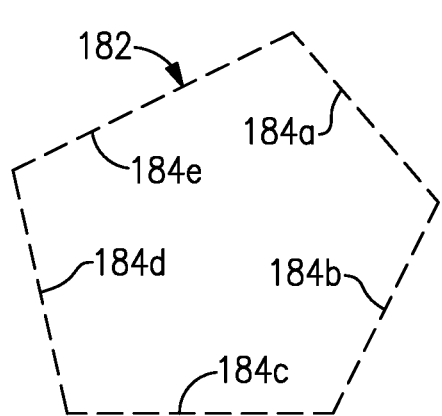
Figure 13D:
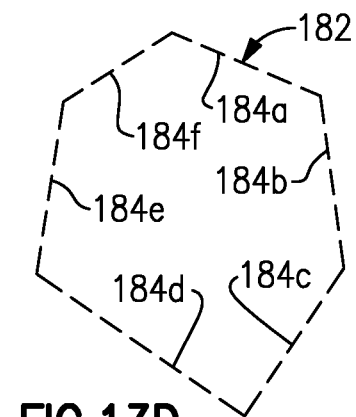

In the examples of FIGS. 13A and 13B, each resonator shape 112 is based on a respective four-sided polygon. In some embodiments, a resonator shape can be based on a polygon having different number of sides. For example, FIG. 13C shows that in some embodiments, a resonator shape can be based on a five-sided polygon 182 having five sides 184a, 184b, 184c, 184d, 184e. In another example, FIG. 13D shows that in some embodiments, a resonator shape can be based on a six-sided polygon 182 having five sides 184a, 184b, 184c, 184d, 184e, 184f. Examples related to the foregoing five-sided polygon 182 are described herein in greater detail.

Figure 14:
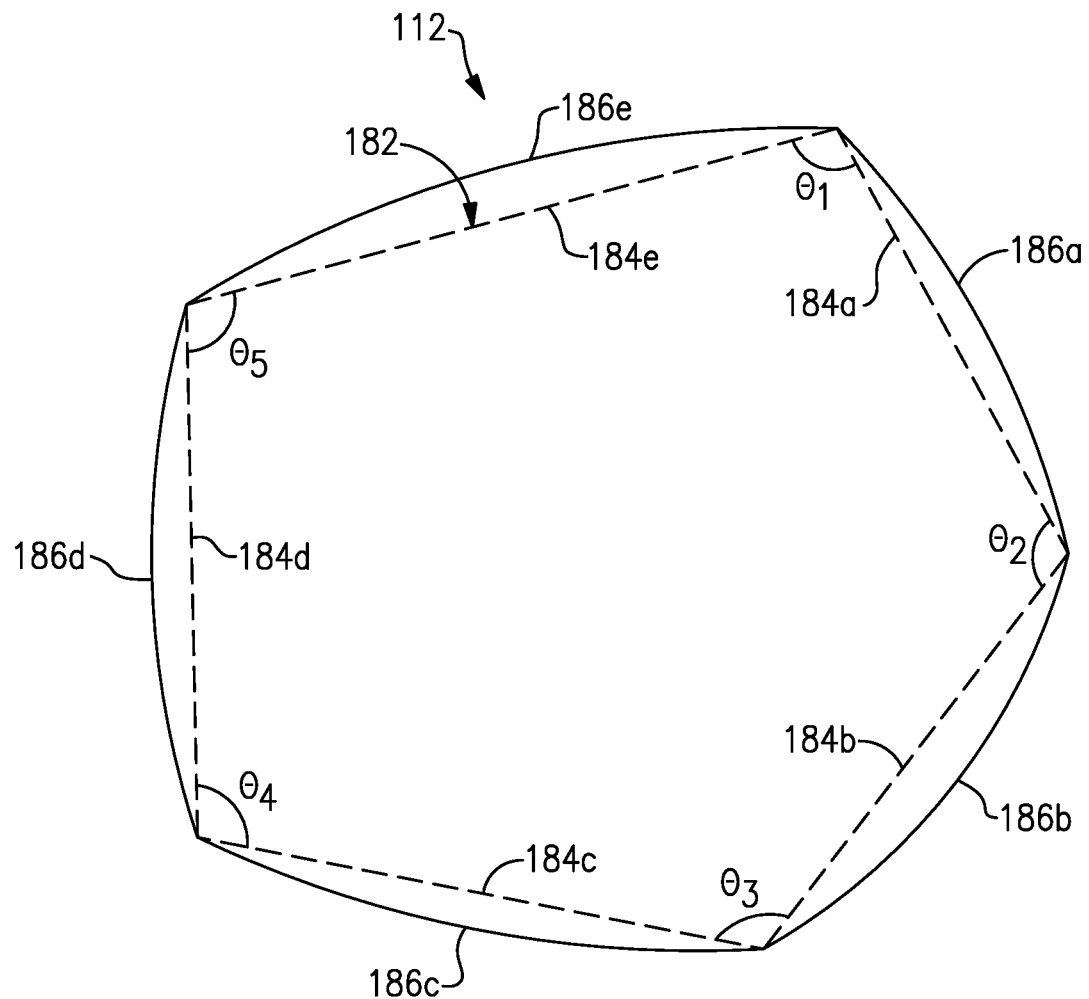
FIG. 14 shows an example where a resonator shape has five curved sections corresponding to a five-sided polygon.

FIG. 14 shows an example of a resonator shape 112 that is based on a five-sided polygon 182 having five sides 184a, 184b, 184c, 184d, 184e. Such five sides are shown to be joined by five vertices having indicated angles $\theta_1, \theta_2, \theta_3, \theta_4, \theta_5$. More particularly, the vertex with the angle $\theta_1$ is between the sides 184e and 184a; the vertex with the angle $\theta_2$ is between the sides 184a and 184b; the vertex with the angle $\theta_3$ is between the sides 184b and 184c; the vertex with the angle $\theta_4$ is between the sides 184c and 184d; and the vertex with the angle $\theta_5$ is between the sides 184d and 184e.

In some embodiments, the angle $\theta_1$ can have a value of 108±10 degrees; the angle $\theta_2$ can have a value of 105±10 degrees; the angle $\theta_3$ can have a value of 118±10 degrees; the angle $\theta_4$ can have a value of 105±10 degrees; and the angle $\theta_5$ can have a value of 104±10 degrees, such that the sum of the five angles is approximately 540 degrees. In some embodiments, the angle $\theta_1$ can have a value of 108±5 degrees; the angle $\theta_2$ can have a value of 105±5 degrees; the angle $\theta_3$ can have a value of 118±5 degrees; the angle $\theta_4$ can have a value of 105±5 degrees; and the angle $\theta_5$ can have a value of 104±5 degrees, such that the sum of the five angles is approximately 540 degrees. In some embodiments, the angle $\theta_1$ can have a value of 108±2 degrees; the angle $\theta_2$ can have a value of 105±2 degrees; the angle $\theta_3$ can have a value of 118±2 degrees; the angle $\theta_4$ can have a value of 105±2 degrees; and the angle $\theta_5$ can have a value of 104±2 degrees, such that the sum of the five angles is approximately 540 degrees. In some embodiments, the angle $\theta_1$ can have a value of 108±1 degrees; the angle $\theta_2$ can have a value of 105±1 degrees; the angle $\theta_3$ can have a value of 118±1 degrees; the angle $\theta_4$ can have a value of 105±1 degrees; and the angle $\theta_5$ can have a value of 104±1 degrees, such that the sum of the five angles is approximately 540 degrees. In some embodiments, the angle $\theta_1$ can have a value of approximately 108 degrees; the angle $\theta_2$ can have a value of approximately 105 degrees; the angle $\theta_3$ can have a value of approximately 118 degrees; the angle $\theta_4$ can have a value of approximately 105 degrees; and the angle $\theta_5$ can have a value of approximately 104 degrees, such that the sum of the five angles is approximately 540 degrees.

In some embodiments, the angle $\theta_1$ can have a value of 104±10 degrees; the angle $\theta_2$ can have a value of 114±10 degrees; the angle $\theta_3$ can have a value of 116±10 degrees; the angle $\theta_4$ can have a value of 102±10 degrees; and the angle $\theta_5$ can have a value of 104±10 degrees, such that the sum of the five angles is approximately 540 degrees. In some embodiments, the angle $\theta_1$ can have a value of 104±5 degrees; the angle $\theta_2$ can have a value of 114±5 degrees; the angle $\theta_3$ can have a value of 116±5 degrees; the angle $\theta_4$ can have a value of 102±5 degrees; and the angle $\theta_5$ can have a value of 104±5 degrees, such that the sum of the five angles is approximately 540 degrees. In some embodiments, the angle $\theta_1$ can have a value of 104±2 degrees; the angle $\theta_2$ can have a value of 114±2 degrees; the angle $\theta_3$ can have a value of 116±2 degrees; the angle $\theta_4$ can have a value of 102±2 degrees; and the angle $\theta_5$ can have a value of 104±2 degrees, such that the sum of the five angles is approximately 540 degrees. In some embodiments, the angle $\theta_1$ can have a value of 104±1 degrees; the angle $\theta_2$ can have a value of 114±1 degrees; the angle $\theta_3$ can have a value of 116±1 degrees; the angle $\theta_4$ can have a value of 102±1 degrees; and the angle $\theta_5$ can have a value of 104±1 degrees, such that the sum of the five angles is approximately 540 degrees. In some embodiments, the angle $\theta_1$ can have a value of approximately 104 degrees; the angle $\theta_2$ can have a value of approximately 114 degrees; the angle $\theta_3$ can have a value of approximately 116 degrees; the angle $\theta_4$ can have a value of approximately 102 degrees; and the angle $\theta_5$ can have a value of approximately 104 degrees, such that the sum of the five angles is approximately 540 degrees.

In some embodiments, the angle $\theta_1$ can have a value of 120±10 degrees; the angle $\theta_2$ can have a value of 107±10 degrees; the angle $\theta_3$ can have a value of 101±10 degrees; the angle $\theta_4$ can have a value of 126±10 degrees; and the angle $\theta_5$ can have a value of 86±10 degrees, such that the sum of the five angles is approximately 540 degrees. In some embodiments, the angle $\theta_1$ can have a value of 120±5 degrees; the angle $\theta_2$ can have a value of 107±5 degrees; the angle $\theta_3$ can have a value of 101±5 degrees; the angle $\theta_4$ can have a value of 126±5 degrees; and the angle $\theta_5$ can have a value of 86±5 degrees, such that the sum of the five angles is approximately 540 degrees. In some embodiments, the angle $\theta_1$ can have a value of 120±2 degrees; the angle $\theta_2$ can have a value of 107±2 degrees; the angle $\theta_3$ can have a value of 101±2 degrees; the angle $\theta_4$ can have a value of 126±2 degrees; and the angle $\theta_5$ can have a value of 86±2 degrees, such that the sum of the five angles is approximately 540 degrees. In some embodiments, the angle $\theta_1$ can have a value of 120±1 degrees; the angle $\theta_2$ can have a value of 107±1 degrees; the angle $\theta_3$ can have a value of 101±1 degrees; the angle $\theta_4$ can have a value of 126±1 degrees; and the angle $\theta_5$ can have a value of 86±1 degrees, such that the sum of the five angles is approximately 540 degrees. In some embodiments, the angle $\theta_1$ can have a value of approximately 120 degrees; the angle $\theta_2$ can have a value of approximately 107 degrees; the angle $\theta_3$ can have a value of approximately 101 degrees; the angle $\theta_4$ can have a value of approximately 126 degrees; and the angle $\theta_5$ can have a value of approximately 86 degrees, such that the sum of the five angles is approximately 540 degrees.

It will be understood that other values or ranges of the five angles ($\theta_1$, $\theta_2$, $\theta_3$, $\theta_4$, $\theta_5$) in FIG. 14 can be utilized. It will also be understood that dimensions of the five sides (184a, 184b, 184c, 184d, 184e) can be selected based on the overall lateral dimensions of the resonator, to support a given set of five angles, including the example angle sets described above.

In the example of FIG. 14, five curved sections corresponding to the five sides 184a, 184b, 184c, 184d, 184e are indicated as 186a, 186b, 186c, 186d, 186e, respectively. In some embodiments, each of such curved sections can be a curved section of an ellipse or a non-ellipse shape. For example, each of the curved sections 186a, 186b, 186c, 186d, 186e can be a portion of an ellipse.

In the context of the curved sections 186a, 186b, 186c, 186d, 186e being parts of ellipses, it will be understood that in some embodiments, such curved sections can be parts of a plurality of ellipses. For example, a portion of a given ellipse can correspond to each curved section, such that the five curved sections 186a, 186b, 186c, 186d, 186e correspond to parts of five ellipses. In another example, a given ellipse can provide two curved sections (e.g., 186e and 186b), such that the five curved sections 186a, 186b, 186c, 186d, 186e correspond to parts of less than five ellipses.

In some embodiments, a given curved section can be symmetric or asymmetric about a normal line at the midpoint of the corresponding side. In some embodiments, two neighboring curved sections (e.g., 186e and 186a) can be selected such that the two neighboring curved sections define an inward facing concave shape at the corresponding vertex (e.g., at the vertex corresponding to angle $\theta_1$).

Figure 15:
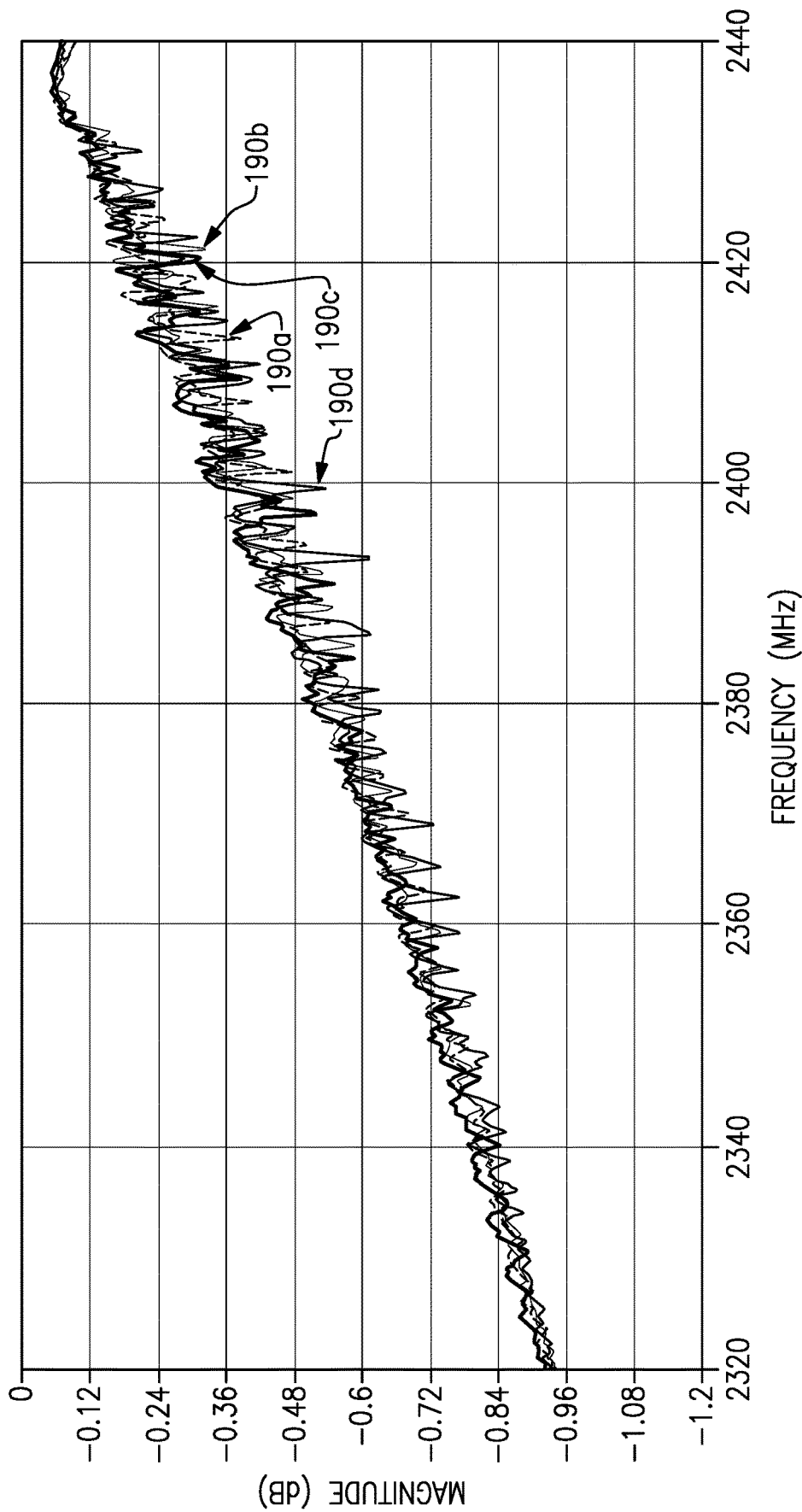
FIG. 15 shows S21 plots for various shaped resonators.

FIG. 15 shows plots of scattering parameter S21 for various shaped resonators. Similar to the examples of FIGS. 6-10, larger fluctuations in a given curve correspond to larger noise.

In FIG. 15, the S21 plot indicated as 190a corresponds to a resonator shape similar to the example of FIG. 5B; the S21 plot indicated as 190b corresponds to a resonator shape similar to the example of FIG. 5E; and the S21 plot indicated as 190c corresponds to a resonator shape similar to the example of FIG. 14. The S21 plot indicated as 190d corresponds to a resonator shape having approximately half of a first ellipse with the cut base having a concave shape of a second ellipse, such that the resonator shape is symmetric about the major axis fo the first ellipse.

Based on the examples shown in FIG. 15, one can see that the resonators corresponding to the plots 190b (FIG. 5E) and 190c (FIG. 14) provide reduced noise when compared to the other configurations.

In the various examples described herein, a resonator shape can be defined by an outline of an overlap of first and second electrodes of a bulk acoustic resonator, where first electrode has a first lateral shape and the second electrode has a second lateral shape. It will be understood that the first and second lateral shapes can have different configurations to provide the resonator shape. For example, neither of the first and second lateral shape may have the same lateral shape as the resonator shape, but when overlapped, the resulting outline can have the resonator shape. In another example, at least one of the first and second lateral shape can be configured to have substantially the same lateral shape as the resonator shape. In such a configuration, one of the first and second lateral shape can be configured to have substantially the same lateral shape as the resonator shape, and the other lateral shape can be configured to have a larger area to thereby include a non-overlapping portion. Also in such a configuration, each of the first and second lateral shape can be configured to have substantially the same lateral shape as the resonator shape.

In some of the examples described herein, such as in the examples of FIGS. 11-14, the foregoing resonator shape can include N curved sections joined by N vertices of an N-sided polygon, where N can be, for example, an integer greater or equal to 4. For the purpose of description, it will be understood that in some embodiments, each of such N curved sections can be a smooth curve. Further, each of the N vertices can be defined by joining of two neighboring smooth curves, such that the two neighboring smooth curves combined is not a smooth curve due to the respective vertex. For example, and referring to the example of FIG. 14, each of the two neighboring curves 186b and 186c is a smooth curve, but the combination of the curves 186b and 186c with the vertex therebetween is not a smooth curve in embodiments when the two curves are parts of separate shapes. Accordingly, in some embodiments, each of the N vertices can be a sharp point between two neighboring smooth curves.

Figure 16:
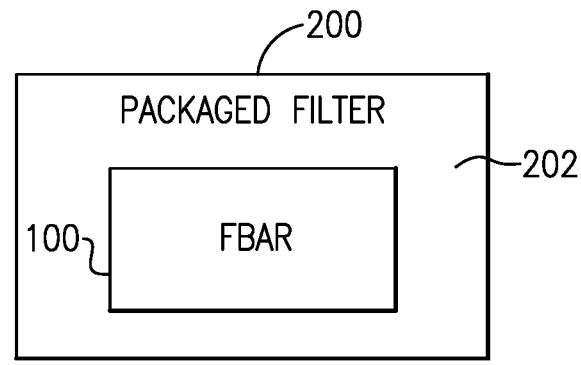
FIG. 16 shows that in some embodiments, an FBAR device having one or more features as described herein can be implemented as, or be a part of, a packaged filter.

FIG. 16 shows that a FBAR device 100 having one or more features as described herein can be implemented as, or be part of, a packaged filter 200. In some embodiments, such a packaged filter can include a substrate 202 on configured to support the FBAR functionality. In some embodiments, a FBAR device, such as the example of FIG. 4 (which includes its own substrate 102) can be mounted on another substrate (e.g., the packaging substrate 202 of FIG. 16). In some embodiments, the substrate 102 of the FBAR device 100 of FIG. 4 can also be the packaging substrate 202 of FIG. 16.

In some embodiments, the packaged filter 200 of FIG. 16 can be configured to provide radio-frequency (RF) operation.

Figure 17:
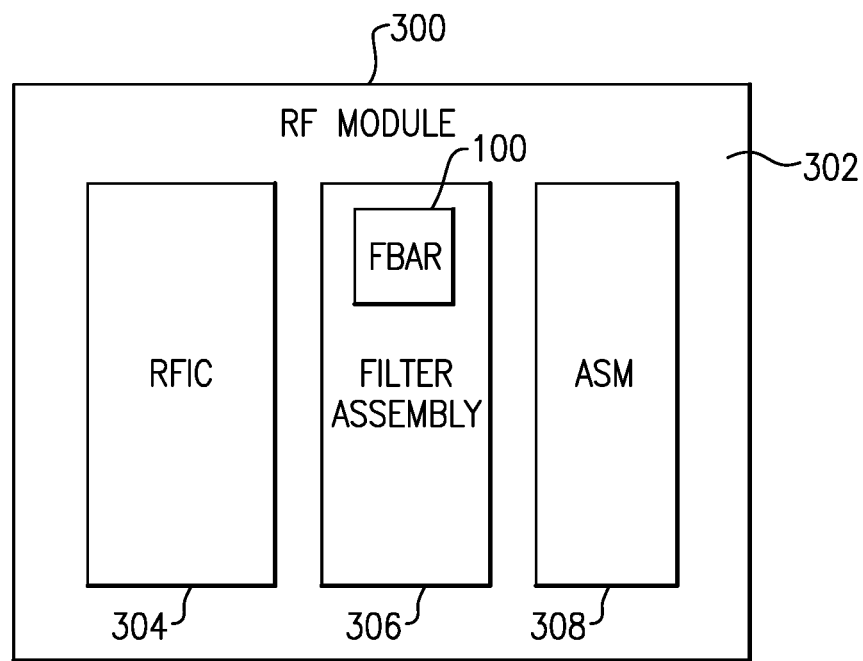
FIG. 17 shows that in some embodiments, a radio-frequency (RF) module can include an FBAR device having one or more features as described herein.

FIG. 17 shows that an RF module 300 can include a FBAR device 100 having one or more features as described herein. In some embodiments, such an RF module can include, a filter assembly 306, and one or more of the FBAR devices 100 can provide some or all filtering functionalities for such a filter assembly. In some embodiments, the RF module 300 can also include, for example, an RF integrated circuit (RFIC) 304, and an antenna switch module (ASM) 308. Such an example module can be, for example, a front-end module configured to support wireless operations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 18:
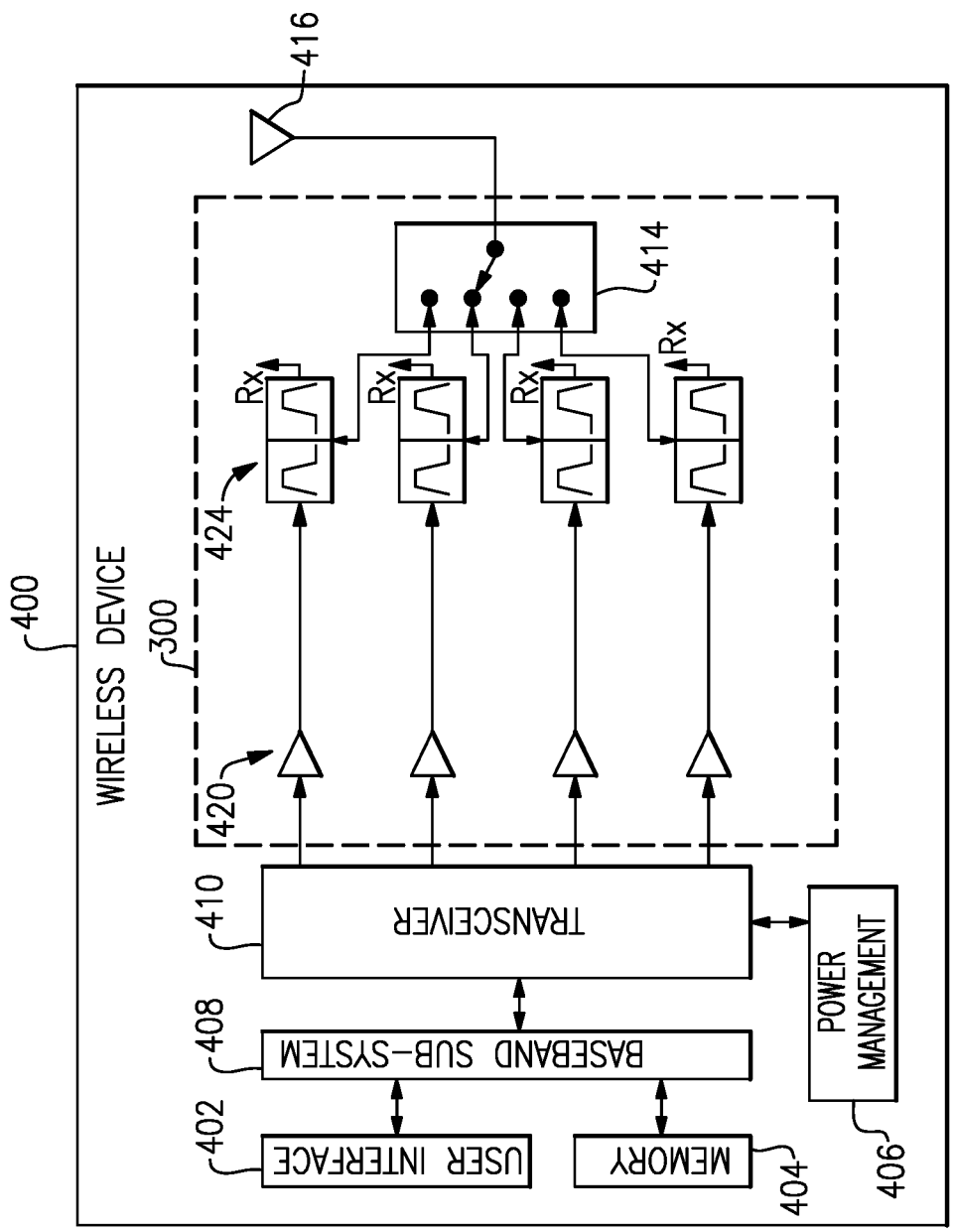
FIG. 18 depicts an example wireless device having one or more advantageous features described herein.

FIG. 18 depicts an example wireless device 400 having one or more advantageous features described herein. In the context of a module having one or more features as described herein, such a module can be generally depicted by a dashed box 300, and can be implemented as, for example, a front-end module (FEM). In such an example, one or more FBAR devices as described herein can be included in, for example, an assembly of filters such as duplexers 424.

Referring to FIG. 18, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be routed to their respective duplexers 424. Such amplified and filtered signals can be routed to an antenna 416 through an antenna switch 414 for transmission. In some embodiments, the duplexers 424 can allow transmit and receive operations to be performed simultaneously using a common antenna (e.g., 416). In FIG. 18, received signals are shown to be routed to "Rx" paths (not shown) that can include, for example, a low-noise amplifier (LNA).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A bulk acoustic resonator comprising:
a piezoelectric layer having a first side and a second side; and
a first electrode implemented on the first side of the piezoelectric layer; and
a second electrode implemented on the second side of the piezoelectric layer, the first and second electrodes dimensioned to provide a resonator shape defined by an outline of an overlap of the first and second electrodes, the resonator shape including N curves joined by N vertices of an N-sided polygon having an inside, each curve having a concave shape with respect to the inside of the N-sided polygon, the resonator shape configured to have no axis of symmetry.

2. The bulk acoustic resonator of claim 1 wherein the quantity N of the number of vertices is an integer greater or equal to 4.

3. The bulk acoustic resonator of claim 2 wherein the quantity N of the number of vertices is equal to 5.

4. The bulk acoustic resonator of claim 1 wherein each of the N vertices is a sharp point between the respective neighboring curves.

5. The bulk acoustic resonator of claim 1 wherein each of the N curves is a part of an ellipse.

6. The bulk acoustic resonator of claim 5 wherein at least two of the N curves are parts of one ellipse.

7. The bulk acoustic resonator of claim 5 wherein the N curves are parts of N respective ellipses.

8. The bulk acoustic resonator of claim 1 wherein the bulk acoustic resonator is a film bulk acoustic resonator.

9. The bulk acoustic resonator of claim 1 wherein neither of the first and second electrodes has the same lateral shape as the resonator shape.

10. The bulk acoustic resonator of claim 1 wherein at least one of the first and second electrodes is configured to have a lateral shape that is substantially the same as the resonator shape.

11. The bulk acoustic resonator of claim 10 wherein one of the first and second electrodes is configured to have substantially the same lateral shape as the resonator shape, and the other electrode is configured to have a larger area to thereby include a non-overlapping portion.

12. The bulk acoustic resonator of claim 10 wherein each of the first and second electrodes is configured to have substantially the same lateral shape as the resonator shape.

13. A method for fabricating a bulk acoustic resonator, the method comprising:
forming or providing a piezoelectric layer having a first side and a second side;
forming or positioning a first electrode on the first side of the piezoelectric layer; and
forming or positioning a second electrode on the second side of the piezoelectric layer to provide a defined by an outline of an overlap of the first and second electrodes, the resonator shape including N curves joined by N vertices of an N-sided polygon having an inside, each curve having a concave shape with respect to the inside of the N-sided polygon, the resonator shape configured to have no axis of symmetry.

14. A film bulk acoustic resonator device comprising:
a substrate;
first and second electrodes implemented over the substrate; and
a piezoelectric layer implemented between the first and second electrodes that are configured to provide a resonator shape defined by an outline of an overlap of the first and second electrodes, the resonator shape including N curves joined by N vertices of an N-sided polygon having an inside, each curve having a concave shape with respect to the inside of the N-sided polygon, the resonator shape configured to have no axis of symmetry.

15. The film bulk acoustic resonator device of claim 14 wherein the film bulk acoustic resonator device is a radio-frequency filter.

16. The film bulk acoustic resonator device of claim 14 further comprising a packaging substrate that supports the film bulk acoustic resonator device in an assembly implemented as a packaged module.

17. The film bulk acoustic resonator device of claim 16 wherein the packaged module is a front-end module configured to support wireless operations involving radio-frequency signals.

18. The film bulk acoustic resonator device of claim 17 wherein the front-end module is configured to provide cellular communication functionality.

* * * * *